United States Patent
Nishino et al.

(10) Patent No.: US 8,253,301 B2
(45) Date of Patent: Aug. 28, 2012

(54) ELECTRONIC COMPONENT AND METHOD FOR MANUFACTURING ELECTRONIC COMPONENT

(75) Inventors: Taro Nishino, Yasu (JP); Takashi Iwamoto, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 550 days.

(21) Appl. No.: 12/507,284

(22) Filed: Jul. 22, 2009

(65) Prior Publication Data
US 2010/0052472 A1 Mar. 4, 2010

(30) Foreign Application Priority Data
Aug. 27, 2008 (JP) ................................ 2008-218053

(51) Int. Cl.
*H01L 41/08* (2006.01)
(52) U.S. Cl. ............ 310/313 D; 310/313 A; 310/313 R; 310/324
(58) Field of Classification Search .............. 310/313 A, 310/313 R, 324, 313 D
See application file for complete search history.

(56) References Cited

U.S. PATENT DOCUMENTS

| | | | |
|---|---|---|---|
| 6,355,498 B1 * | 3/2002 | Chan et al. ...................... | 438/48 |
| 6,445,265 B1 | 9/2002 | Wright | |
| 7,299,529 B2 * | 11/2007 | Ginsburg et al. ............ | 29/25.35 |
| 7,479,685 B2 * | 1/2009 | Fazzio et al. .................. | 257/416 |
| 2005/0035828 A1 | 2/2005 | Kyoung et al. | |
| 2007/0007860 A1 * | 1/2007 | Takabe et al. ................. | 310/324 |
| 2007/0009732 A1 * | 1/2007 | Tsai et al. ..................... | 428/349 |
| 2007/0188047 A1 | 8/2007 | Tanaka | |
| 2008/0024037 A1 | 1/2008 | Tamura et al. | |
| 2010/0088868 A1 | 4/2010 | Kando et al. | |

FOREIGN PATENT DOCUMENTS

| | | |
|---|---|---|
| JP | 11-087682 A | 3/1999 |
| JP | 2002-016466 A | 1/2002 |
| JP | 2002-503885 A | 2/2002 |
| JP | 2002-534886 A | 10/2002 |
| JP | 2003-017967 A | 1/2003 |
| JP | 2004-312657 A | 11/2004 |
| JP | 2005-342817 A | 12/2005 |
| JP | 2006-186900 A | 7/2006 |
| JP | 2007-251910 A | 9/2007 |
| JP | 2008-054276 A | 3/2008 |
| WO | 99/41779 A1 | 8/1999 |
| WO | 2009/081651 A1 | 7/2009 |

OTHER PUBLICATIONS

Official Communication issued in corresponding Chinese Patent Application No. 2008-218053, mailed on Jun. 24, 2010.

* cited by examiner

*Primary Examiner* — Derek Rosenau
*Assistant Examiner* — Bryan Gordon
(74) *Attorney, Agent, or Firm* — Keating & Bennett, LLP

(57) ABSTRACT

A method for manufacturing an electronic component includes a first step of preparing a piezoelectric body with a flat surface, a second step of implanting ions into the piezoelectric body such that an ion-implanted layer is formed in the piezoelectric body, a third step of forming sacrificial layers on the flat surface of the piezoelectric body, a fourth step of forming an insulating body over the flat surface of the piezoelectric body and the sacrificial layers to form a piezoelectric structure, a fifth step of dividing the piezoelectric body at the ion-implanted layer to form a piezoelectric laminar structure in which a piezoelectric film separated from the piezoelectric body is bonded to the insulating body, a sixth step of forming electrodes on portions of a division surface of the piezoelectric film, and a seventh step of removing the sacrificial layers from the piezoelectric laminar structure.

3 Claims, 7 Drawing Sheets

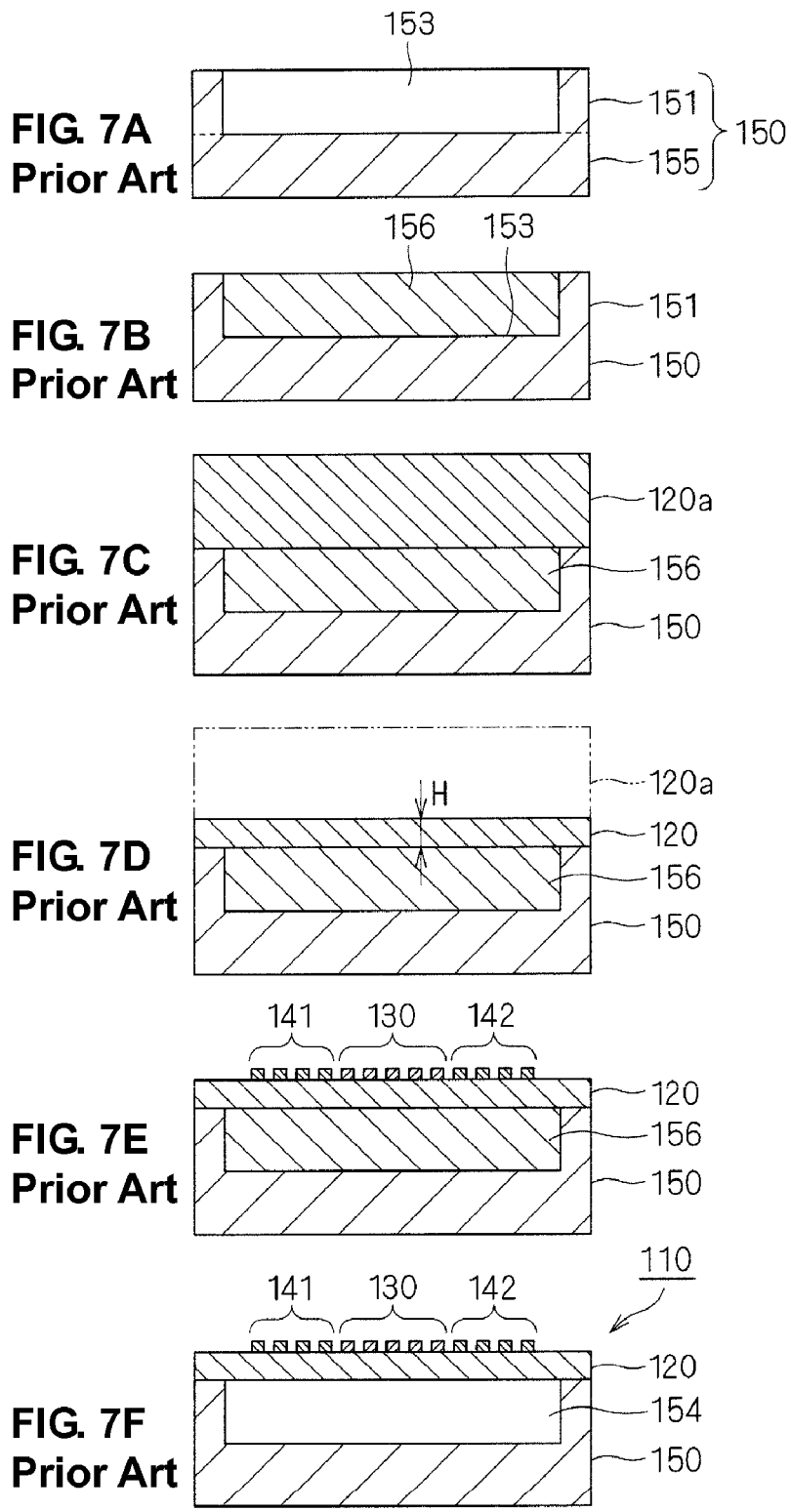

ELECTRONIC COMPONENT AND METHOD FOR MANUFACTURING ELECTRONIC COMPONENT

BACKGROUND OF THE INVENTION

1. Field of the Invention

The present invention relates to electronic components and methods for manufacturing the electronic components. The present invention particularly relates to an electronic component, such as a plate wave device using a Lamb wave or an SH wave, including a support member and a vibrating or movable portion such as a gyro or an RF switch and also relates to a method for manufacturing the electronic component. The vibrating or movable portion is levitationally supported with the support member.

2. Description of the Related Art

Conventional electronic components include support members and vibrating or movable portions using plate waves. The vibrating or movable portions are levitationally supported with the support members.

For example, Japanese Unexamined Patent Application Publication No. 2007-251910 discloses a Lamb wave device. FIG. 5 shows the Lamb wave device, which is represented by reference numeral 110, in cross section. The Lamb wave device 110 includes a reinforcing substrate 150 which is a support member and which has a recessed portion 153, a piezoelectric substrate 120 bonded to the reinforcing substrate 150, and a vibrating portion levitationally supported with the reinforcing substrate 150. The piezoelectric substrate 120 has a region spaced from the reinforcing substrate 150 with a space 154 in the recessed portion 153 located therebetween. The region carries an IDT electrode 130, first reflectors 141, and second reflectors 142.

The Lamb wave device 110 is manufactured through steps shown in FIGS. 7A to 7F. As shown in FIG. 7A, the recessed portion 153 is formed in the reinforcing substrate 150, which is made of silicon and is flat. As shown in FIG. 7B, a sacrificial layer 156 is formed in the recessed portion 153. The sacrificial layer 156 and the upper surface of a peripheral portion 151 of the reinforcing substrate 150 are smoothed by a chemical mechanical polishing (CMP) process or the like. As shown in FIG. 7C, a quartz slab 120a for forming the piezoelectric substrate 120 is bonded to the reinforcing substrate 150 by a direct bonding process, a chemical bonding process, or a bonding process using an adhesive or the like. As shown in FIG. 7D, the quartz slab 120a is polished, whereby the piezoelectric substrate 120 is formed so as to have a predetermined thickness represented by H. As shown in FIG. 7E, the IDT electrode 130 and the first and second reflectors 141 and 142 are formed on the piezoelectric substrate 120. As shown in FIG. 7F, the sacrificial layer 156 is removed, whereby the space 154 is formed. This allows the vibrating portion to be levitationally supported with the reinforcing substrate 150.

For example, PCT Japanese Translation Patent Publication No. 2002-503885 discloses a method for forming a single-crystalline thin-film. The single-crystalline thin-film is formed by the following procedure: a damaged layer is formed by implanting ions into a region of a single-crystalline substrate that is located at a predetermined depth from a surface of the single-crystalline substrate and a region of the single-crystalline substrate that is located between the damaged layer and the surface of the single-crystalline substrate is then stripped off. The method is known as an ion-slicing process. According to the ion-slicing process, the depth of a damaged layer can be varied by adjusting ion implantation parameters and a single-crystalline thin-film with a thickness on the order of micrometers can be formed.

For example, Japanese Unexamined Patent Application Publication No. 2008-54276 discloses a method for producing a piezoelectric film. FIG. 6 shows the piezoelectric film, which is represented by reference numeral 111, in cross section. The piezoelectric film 111 is produced in such a manner that a sprayed film 112 serving as a support member is formed on a rough principal surface 111a of a piezoelectric body so as to have a thickness of several hundreds of micrometers and the thickness of the piezoelectric body is reduced by polishing. The piezoelectric film 111 and the sprayed film 112 form a conjugate 101.

It is difficult to efficiently manufacture the Lamb wave device 110 because the quartz slab 120a is polished into the piezoelectric substrate 120 in such a state that the piezoelectric substrate 120 is bonded to the reinforcing substrate 150 as shown in FIG. 7C.

In order to excite a Lamb wave at an RF band with the vibrating portion of the Lamb wave device 110 shown in FIG. 5, the piezoelectric substrate 120 needs to have a thickness of several micrometers depending on the frequency of the Lamb wave. Therefore, the piezoelectric substrate 120 is fragile and is difficult to handle. This causes the problem of low product yield.

The use of a thin piezoelectric film requires a piezoelectric body and support member, which are to be bonded to each other, to have high flatness. Therefore, there is a problem in that the CMP slurry used to planarize the piezoelectric body and the support member by polishing or grinding needs to be adjusted depending on a material contained in the piezoelectric body or the support member. In the case of using an adhesive or the like to bond the piezoelectric body to an insulating body, there are problems with the elasticity of the adhesive and the change thereof with time. In the case where the piezoelectric body and the support member are bonded to each other at room temperature, expensive apparatuses such as a surface-cleaning apparatus and a vacuum chamber are necessary. Such apparatuses have low throughput.

SUMMARY OF THE INVENTION

Accordingly, preferred embodiments of the present invention provide an electronic component including a piezoelectric film having a levitationally supported portion. Other preferred embodiments of the present invention provide a method for manufacturing the electronic component. In the method, the piezoelectric film can be efficiently formed.

In order to solve the above problems, a preferred embodiment of the present invention provides a method for manufacturing an electronic component configured as described below.

The method includes (i) a first step of preparing a piezoelectric body with a flat surface; (ii) a second step of implanting ions into the piezoelectric body through the flat surface thereof such that an ion-implanted layer is formed in a region located at a predetermined depth from the flat surface of the piezoelectric body; (iii) a third step of forming sacrificial layers on a portion of the flat surface of the piezoelectric body; (iv) a fourth step of forming an insulating body over the flat surface of the piezoelectric body and the sacrificial layers to form a piezoelectric structure; (v) a fifth step of dividing the piezoelectric body at the ion-implanted layer by heating the piezoelectric body to form a piezoelectric laminar structure in which a piezoelectric film separated from the piezoelectric body is bonded to the insulating body, the piezoelectric film being a portion of the piezoelectric body that is located between the flat surface of the piezoelectric body and the ion-implanted layer; (vi) a sixth step of forming electrodes on portions of a division surface of the piezoelectric film, the portions corresponding to the sacrificial layers, the division surface extending along the ion-implanted layer; and (vii) a seventh step of removing the sacrificial layers from the piezoelectric laminar structure.

According to the method, the piezoelectric film can be formed on the piezoelectric laminar structure so as to have an extremely small thickness. A piezoelectric laminar structure having an extremely thin single-crystalline piezoelectric film can be manufactured using, for example, a single-crystalline piezoelectric body.

According to the method, the piezoelectric body separated from the piezoelectric film can be used again to manufacture piezoelectric laminar structures. That is, a large number of piezoelectric laminar structures can be manufactured from the single piezoelectric body. This allows the piezoelectric film to be more efficiently formed as compared to the case of forming a piezoelectric film by polishing a piezoelectric body bonded to a support member, because the amount of waste from the piezoelectric body is small.

The thickness of the piezoelectric film depends on the energy used for ion implantation and is not affected by the roll of a junction between a support member and a piezoelectric body which is bonded thereto and polished. Therefore, the piezoelectric film can be uniformly formed so as to have an extremely small thickness.

In the case where, for example, a single-crystalline piezoelectric substrate is used as the piezoelectric body and the sacrificial layers are formed on a flat surface of the single-crystalline piezoelectric substrate, ordinary front-end steps for manufacturing surface acoustic wave devices can be used.

Deposition processes such as vapor deposition, sputtering, and chemical vapor deposition (CVD) cause large differences in products; hence, it is difficult to form uniform piezoelectric films by such deposition processes. The use of a piezoelectric film separated from, for example, a single-crystalline piezoelectric body is effective in more readily manufacturing an electronic component having good device properties as compared to the use of a piezoelectric film formed by a deposition process.

In the case where sacrificial layers are formed in recessed portions disposed in a support member and a piezoelectric body is bonded to this support member, a step of planarizing these sacrificial layers and a peripheral portion of this support member is necessary. However, the above method requires no planarization step because the sacrificial layers are formed on the piezoelectric body and the insulating body is then formed.

Since the insulating body is formed on the piezoelectric body and the piezoelectric film is then separated from the piezoelectric body, the time that force acts on the interface between the piezoelectric body (or the piezoelectric film) and the insulating body is shorter as compared to the case of polishing a piezoelectric body bonded to a support member. This secures the adhesion between the piezoelectric film and the insulating body and the reliability thereof.

The method does not require a bonding machine which is necessary to directly bond a piezoelectric body to a support member. The bonding machine is usually expensive and has low throughput.

In the fourth step, after an adhesive layer is formed over the flat surface of the piezoelectric body and the sacrificial layers so as to have a surface which is located on the side opposite to piezoelectric body and which is rougher than the flat surface of the piezoelectric body, the insulating body is preferably formed on the rough surface of the adhesive layer, whereby the piezoelectric laminar structure is formed such that the insulating body is bonded to the flat surface of the piezoelectric body and the sacrificial layers with the adhesive layer disposed therebetween.

The presence of the adhesive layer increases the bonding strength between the piezoelectric body and the insulating body.

The adhesive layer may have a rough surface at the point of time when the adhesive layer is formed, the rough surface being located on the side opposite to the piezoelectric body and being rougher than a surface of the piezoelectric body.

The adhesive layer is preferably formed by sputtering or CVD, for example.

In this case, the adhesive layer can be readily formed.

The adhesive layer preferably includes at least one selected from the group consisting of silicon oxides, silicon nitrides, metal oxides, and metal nitrides, for example.

In this case, the adhesive layer can be readily formed.

In the fourth step, after the adhesive layer is formed over the flat surface of the piezoelectric body and the sacrificial layers, a surface of the adhesive layer that is located on the side opposite to piezoelectric body is preferably treated so as to be rougher than the flat surface of the piezoelectric body.

The roughening of this surface of the adhesive layer increases the bonding strength between the piezoelectric body and the insulating body.

The insulating body is preferably formed by a spraying process.

In this case, the insulating body can be readily formed so as to be bonded to the piezoelectric body.

The method preferably further includes a step of filling grain boundaries and pores in the insulating body formed by the spraying process with filler.

Since the grain boundaries and pores in the insulating body formed by the spraying process are filled with filler, the insulating body formed by the spraying process has an increased stiffness.

The insulating body is preferably formed by CVD, for example.

In this case, the insulating body can be readily formed so as to be bonded to the piezoelectric body.

The insulating body is preferably formed by spin coating, for example.

In this case, the insulating body can be readily formed so as to be bonded to the piezoelectric body.

The insulating body is preferably formed by the spin coating of spin-on-glass (SOG), for example.

In this case, the use of SOG allows the insulating body to be readily formed.

Thus, various preferred embodiments of the present invention provide an electronic component having a configuration below.

The electronic component includes (a) a support member, (b) a piezoelectric film which has a pair of principal surfaces substantially parallel to each other and which includes a first portion unsupported with the support member and a second portion supported with the support member, (c) an adhesive layer which is disposed between the support member and the second portion of the piezoelectric film and which is in contact with the support member and the second portion of the piezoelectric film, and (d) electrodes arranged on at least one of the principal surfaces of the first portion of the piezoelectric film. The adhesive layer has a first surface in contact with the support member and a second surface in contact with the second portion of the piezoelectric film and the first surface of the adhesive layer has a roughness greater than that of the second surface thereof.

According to the above configuration, the first surface of the adhesive layer has a large roughness; hence the bonding strength between the piezoelectric film and the support member is large. This allows the electronic component to have high mechanical strength and excellent electrical properties.

The principal surfaces of the piezoelectric film are preferably mirror surfaces.

In this case, an acoustic wave excited by the electrodes propagates without being diffusely reflected. This allows the loss of the acoustic wave to be small.

The electrodes excite a plate wave propagating through the piezoelectric film.

This allows the electronic component to function as a plate wave device.

According to various preferred embodiments of the present invention, an electronic component including a piezoelectric film having a levitationally supported portion can be efficiently manufactured.

Other features, elements, characteristics, steps and advantages of the present invention will become more apparent from the following detailed description of preferred embodiments of the present invention with reference to the attached drawings.

BRIEF DESCRIPTION OF THE DRAWINGS

FIGS. 7A to 7F are sectional views showing steps of a method for manufacturing the known Lamb wave device.

DETAILED DESCRIPTION OF THE PREFERRED EMBODIMENTS

Figure 1:
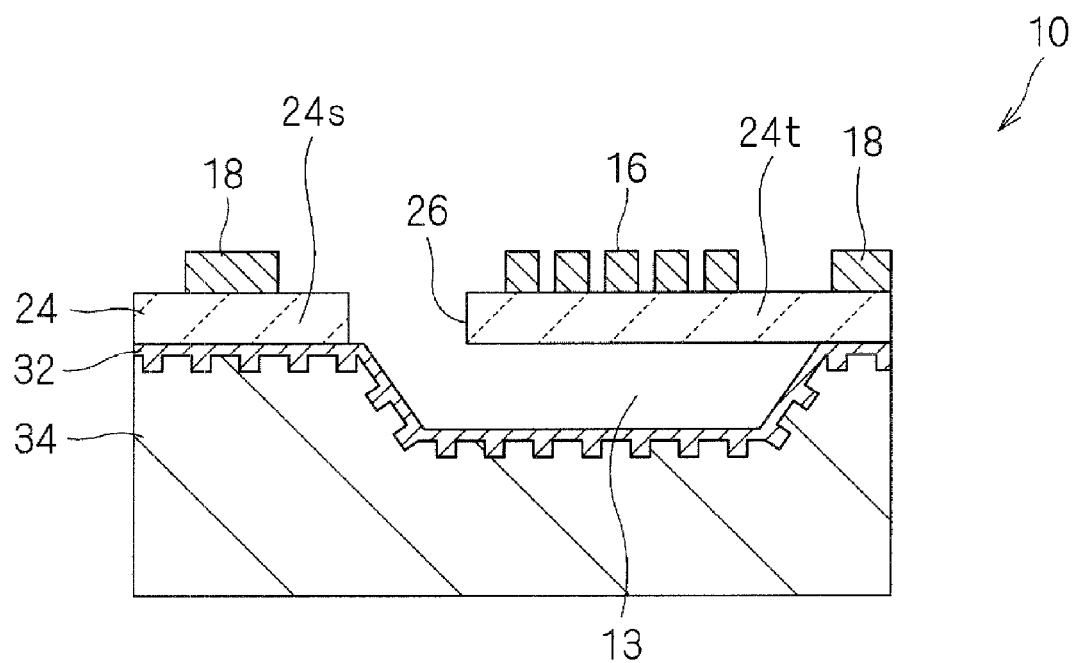
FIG. 1 is a sectional view of an electronic component according to a preferred embodiment of the present invention.

Preferred embodiments of the present invention will now be described with reference to FIGS. 1 to 4D. FIG. 1 is a sectional view of an electronic component 10 according to a preferred embodiment of the present invention. FIGS. 2A to 4D are sectional views showing steps of a method, according to a preferred embodiment of the present invention, for manufacturing the electronic component 10.

With reference to FIG. 1, the electronic component 10 includes a support member 34 that is an insulating body, an adhesive layer 32, and a piezoelectric film 24 supported with the support member 34 with the adhesive layer 32 disposed therebetween. The support member 34 has a space 13.

The piezoelectric film 24 extends on the space 13. The piezoelectric film 24 includes a first portion 24t unsupported by the support member 34 and a second portion 24s supported by the support member 34 with the adhesive layer 32 disposed therebetween. The first portion 24t of the piezoelectric film 24 carries an electrode structure 16 including a pair of IDT electrodes. The first and second portions 24t and 24s of the piezoelectric film 24 carry wiring electrodes 18 connected to the IDT electrodes.

The electronic component 10 preferably is, for example, a plate wave device using a plate wave such as a Lamb wave or an SH wave.

The electrode structure 16 further includes reflectors, which are not shown in FIG. 1, in addition to the IDT electrodes.

The IDT electrodes are interdigital electrodes and each includes a bus bar and a plurality of electrode fingers which are arranged at predetermined intervals and which extend substantially parallel to each other. One end of each electrode finger is connected to a corresponding one of the bus bars so as to define an interdigital shape. The IDT electrodes are arranged such that the bus bars are on opposite sides and the electrode fingers of one of the IDT electrode and those of the other are alternately arranged. A plate wave excited by the IDT electrodes is propagated in the direction in which the electrode fingers are arranged, that is, in the direction substantially perpendicular to the direction in which the electrode fingers extend.

The reflectors are arranged outside the IDT electrodes along the propagation direction of the plate wave. The reflectors each include a plurality of electrode fingers which are arranged at predetermined intervals along the propagation direction of the plate wave and which extend in substantially parallel to each other. Ends of the electrode fingers of each reflector are connected to each other in a grid pattern. The electrode fingers of the reflectors extend substantially perpendicularly to the propagation direction of the plate wave.

The method, which is used to manufacture the electronic component 10, will now be described with reference to FIGS. 2A to 4D. The electronic component 10 preferably is configured as a plate wave device.

Figure 2A:
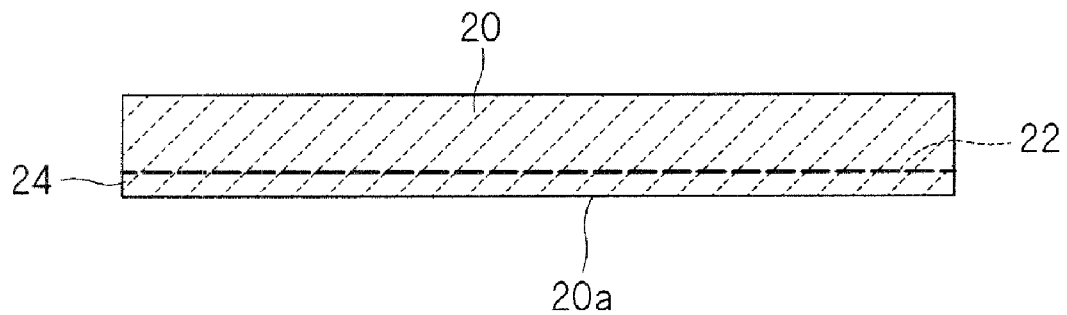
FIGS. 2A to 2C are sectional views showing steps of a method, according to a preferred embodiment of the present invention, for manufacturing the electronic component.

As shown in FIG. 2A, a piezoelectric body 20 with a flat surface 20a is prepared. Ions are implanted into the piezoelectric body 20 through the flat surface 20a thereof, whereby an ion-implanted layer 22 indicated by a broken line is formed in a region located at a predetermined depth from the flat surface 20a thereof. The ion-implanted layer 22 is a portion of the piezoelectric body 20 that has crystal defects. The depth of the ion-implanted layer 22 can be varied by changing ion implantation conditions.

The piezoelectric body 20 preferably is, for example, a portion of a LiTaO$_3$ wafer having a thickness of about 500 μm and a surface roughness Ra of about 0.30 nm. The ion implantation conditions preferably are as follows: the ions are protons, the energy used to implant the ions is about 150 keV, and the dose of the ions is about $1 \times 10^{-17}$ cm$^{-2}$, for example. Under these conditions, the depth of the ion-implanted layer 22 is about 1 μm as described below. The piezoelectric body 20 may be made of LiNbO$_3$ or other suitable material, for example.

Figure 2B:
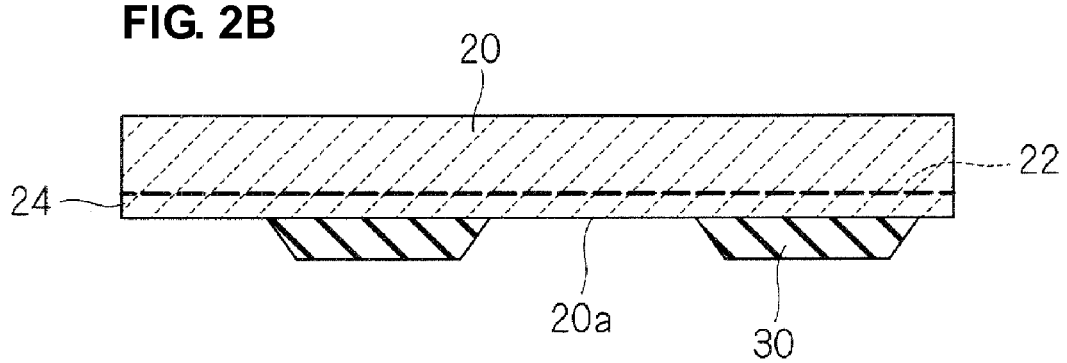

As shown in FIG. 2B, sacrificial layers 30 are formed on a portion of the flat surface 20a of the piezoelectric body 20. The sacrificial layers 30 have an area greater than that of a region in which the plate wave is propagated.

In particular, the sacrificial layers 30 are preferably formed in such a manner that a Cu or resist film with a thickness of about 10 μm is formed over the flat surface 20a of the piezoelectric body 20 by vapor deposition or spin coating, respectively, and then patterned by photolithography, for example. The sacrificial layers 30 preferably have a size of about 150 μm×about 300 μm, for example. The sacrificial layers 30 may be made of SiO$_2$, phosphorus silicate glass (PSG), or ZnO, for example.

Figure 2C:
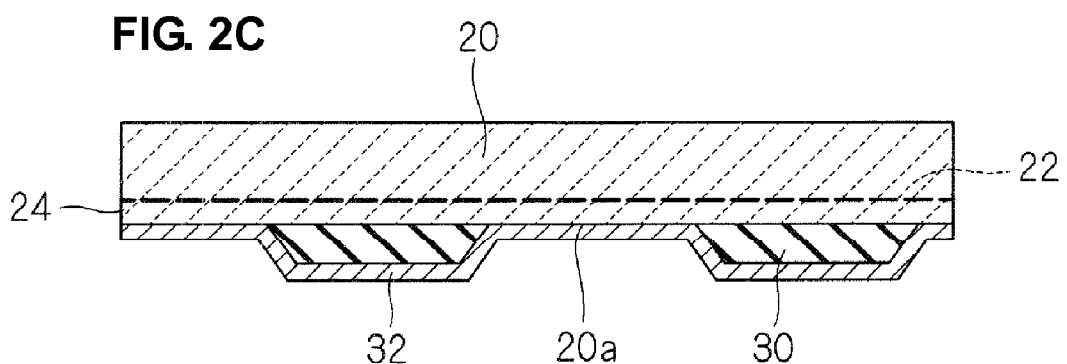

As shown in FIG. 2C, the adhesive layer 32 is formed over the sacrificial layers 30 and the flat surface 20a of the piezoelectric body 20.

The adhesive layer 32 has a thickness of about 10 μm and is made of, for example, SiN, SiO$_2$, or Ta$_2$O$_5$, for example.

Figure 3A:
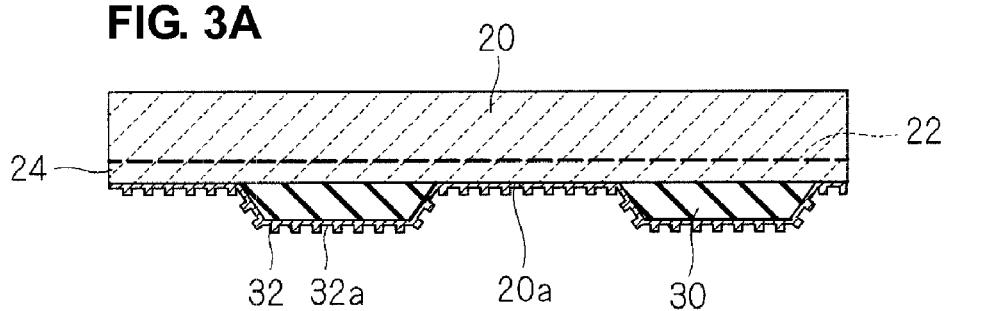
FIGS. 3A to 3D are sectional views showing steps of the method according to a preferred embodiment of the present invention.

As shown in FIG. 3A, a surface 32a of the adhesive layer 32 is roughened so as to have a roughness Ra of about 5 nm or more, for example. In this step, the following portions are surface-roughened: a portion of the adhesive layer 32 that is disposed on the flat surface 20a of the piezoelectric body 20 and portions of the adhesive layer 32 that disposed on the sacrificial layers 30.

Figure 3B:
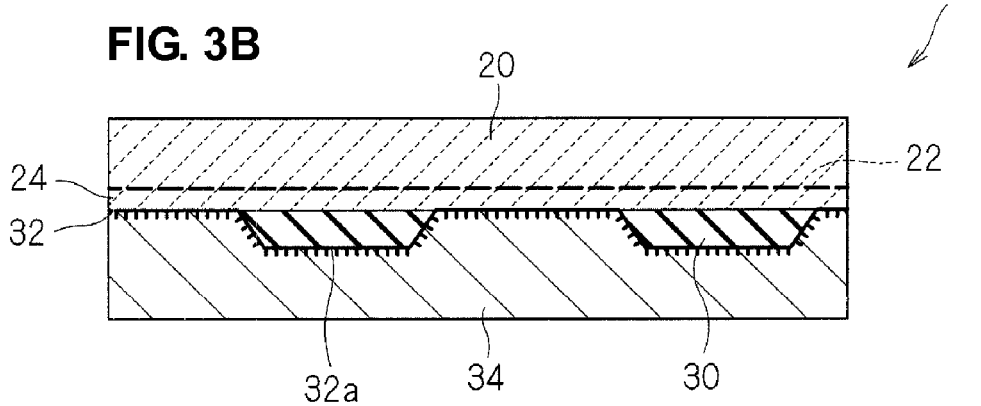

As shown in FIG. 3B, the support member 34 is formed on the roughened surface 32a of the adhesive layer 32 preferably by sputtering, CVD, spraying, or other suitable method, whereby a piezoelectric structure 10s is formed. The support member 34 is preferably formed by spraying in consideration of the forming rate of the support member 34.

The support member 34 preferably has a thickness of about 150 μm and is made of, for example, Al$_2$O$_3$.

When the support member 34 is porous, the stiffness (Young's modulus) thereof is relatively small; hence, the support member 34 may contain filler so as to have an increased stiffness. Alternatively, a curable resin or spin-on-glass (SOG) that is a photosensitive glass material may be applied to the support member 34 by spin coating such that grain boundaries and pores in the support member 34 are filled with the curable resin or SOG, which is then cured. This allows the support member 34 to have an increased stiffness and prevents an undesired material such as a cleaning solution from penetrating the support member 34.

Figure 3C:
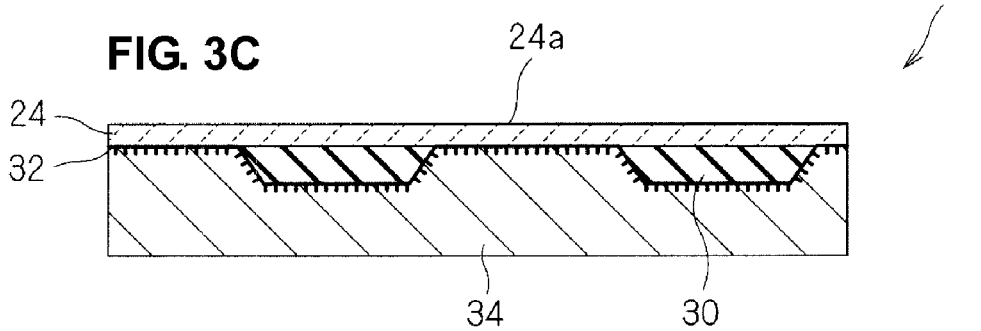

As shown in FIG. 3C, the piezoelectric film 24 is separated from the piezoelectric body 20 in such a manner that the piezoelectric structure 10s is divided at the ion-implanted layer 22, which is disposed in the piezoelectric body 20. The piezoelectric film 24 remains bonded to the support member 34 with the adhesive layer 32 and sacrificial layers 30 disposed therebetween.

The piezoelectric body 20 is divided into the piezoelectric film 24, which is bonded to the adhesive layer 32 and the sacrificial layers 30, and a residual portion by heating, whereby a piezoelectric laminar structure 10t including the piezoelectric film 24 is obtained. When the piezoelectric body 20 has a thickness of about 500 μm, the piezoelectric film 24 has a thickness of about 1 μm and the residual portion of the piezoelectric body 20 has a thickness of about 499 μm, for example.

The residual portion of the piezoelectric body 20, from which the piezoelectric film 24 has been removed, can be used to manufacture other piezoelectric laminar structures. Therefore, a large number of piezoelectric laminar structures can be manufactured from the piezoelectric body 20. This allows the piezoelectric film 24 to be more efficiently formed as compared to the case of forming a piezoelectric film by polishing a piezoelectric body bonded to a support member, because the amount of waste from the piezoelectric body 20 is small.

Figure 3D:
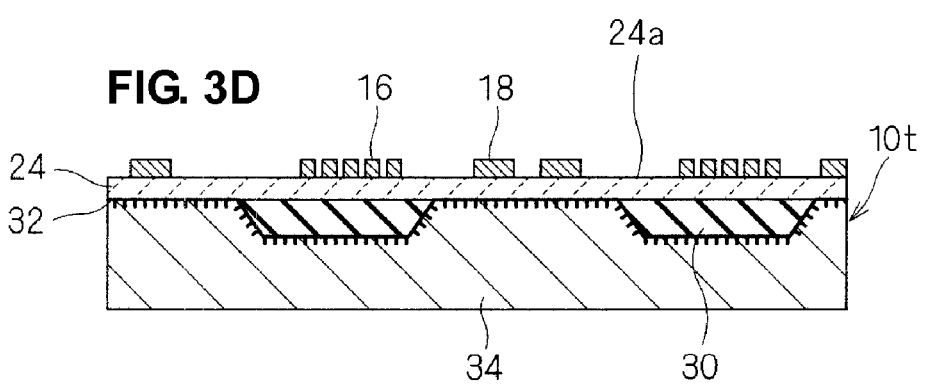

As shown in FIG. 3D, the electrode structure 16, which includes the IDT electrodes and the reflectors, and the wiring electrodes 18, which are connected to the IDT electrodes, are formed on the piezoelectric film 24.

For example, a division surface 24a of the piezoelectric film 24 that is exposed by dividing the piezoelectric body 20 at the ion-implanted layer 22 is polished by chemical mechanical polishing (CMP) so as to have a roughness Ra of about 1 nm or less. The electrode structure 16 and the wiring electrodes 18 are formed on the resulting division surface 24a thereof by a lift-off process. In this step, plate wave elements having a size of about 0.8 mm×about 0.6 mm, for example, are arranged on the wafer in a grid pattern. A pair of principal surfaces of the piezoelectric film 24 are mirror-surfaces and an acoustic wave excited by the IDT electrodes propagates without being diffusely reflected. This allows the loss of the acoustic wave to be small.

Figure 4A:
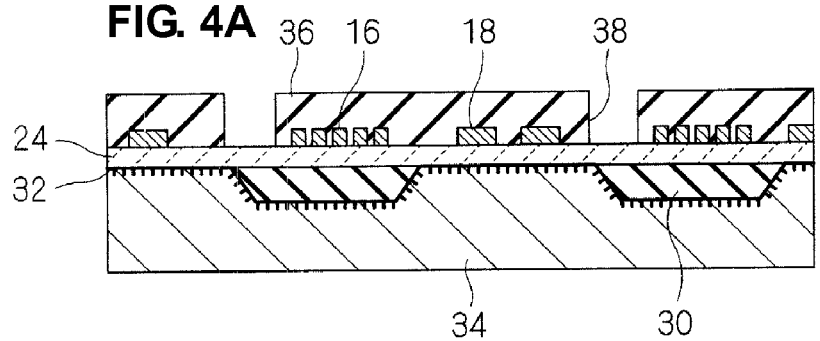
FIGS. 4A to 4D are sectional views showing steps of the method according to a preferred embodiment of the present invention.

As shown in FIG. 4A, a mask pattern 36 is formed over the electrode structure 16 and the wiring electrodes 18 by, for example, photolithography. First perforations 38 for forming second perforations 26 in the piezoelectric film 24 are formed in the mask pattern 36 so as to be disposed above the sacrificial layers 30.

Figure 4B:
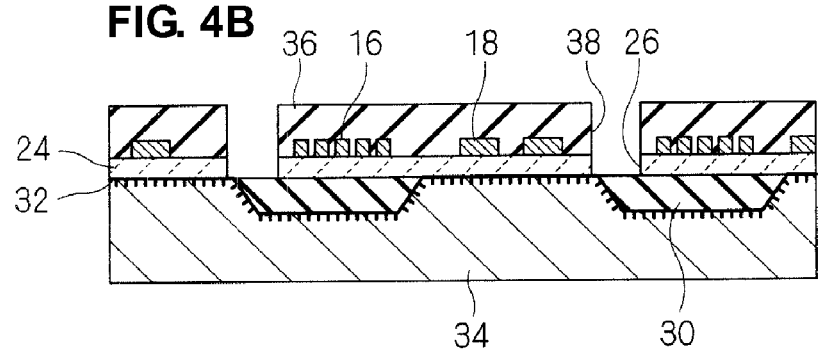

As shown in FIG. 4B, the piezoelectric film 24 is etched through the mask pattern 36, whereby the second perforations 26 are formed in the piezoelectric film 24.

Figure 4C:
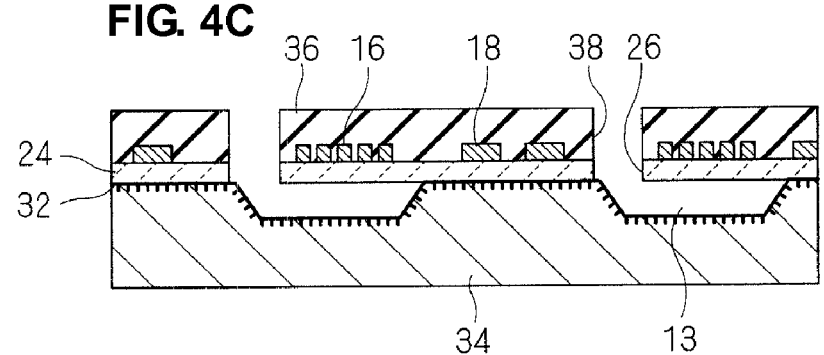

As shown in FIG. 4C, the sacrificial layers 30 are removed through the first perforations 38 and the second perforations 26, which are disposed in the mask pattern 36 and the piezoelectric film 24, respectively.

When the sacrificial layers 30 are made of, for example, SiO$_2$, the sacrificial layers 30 are removed by reactive ion etching (RIE) using a fluorine-containing gas. When the sacrificial layers 30 are made of Cu, the sacrificial layers 30 are removed by etching using ammonium persulfate. When the sacrificial layers 30 are made of a resist, the sacrificial layers 30 are removed by etching using an N-methylpyrrolidone solution.

Figure 4D:
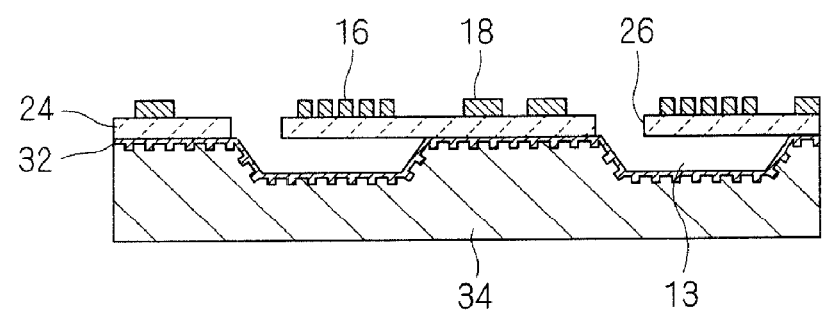
Figure 5:
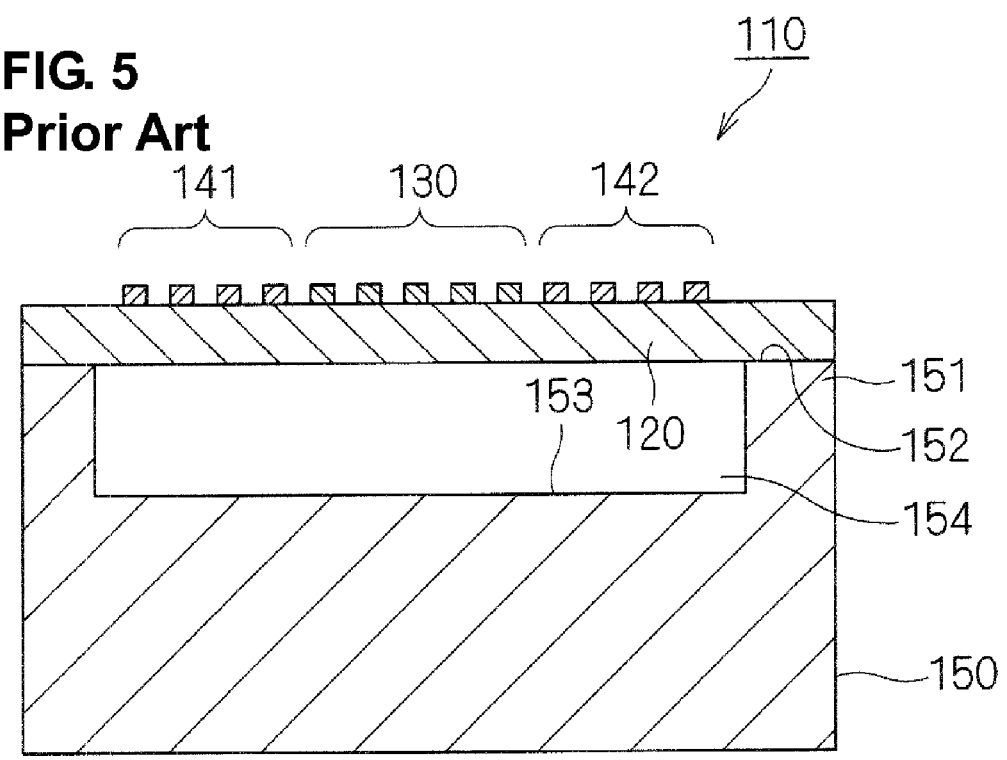
FIG. 5 is a sectional view of a known Lamb wave device.
Figure 6:
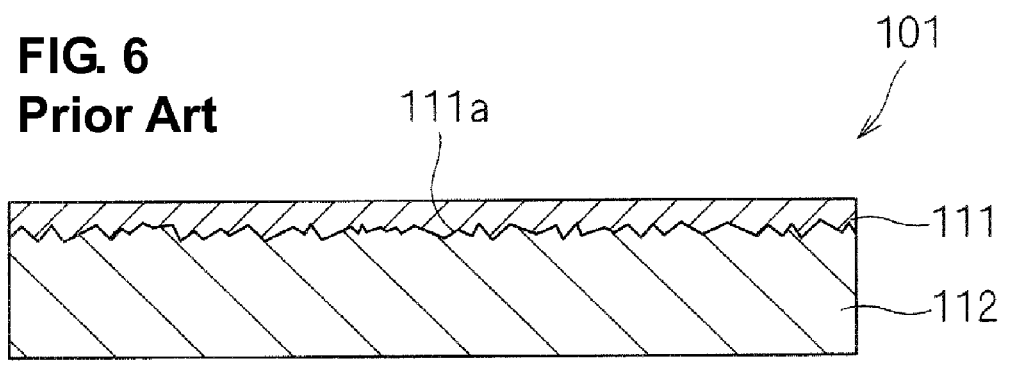
FIG. 6 is a sectional view of a known piezoelectric film.

As shown in FIG. 4D, after the sacrificial layers 30 are removed, the wafer is divided into individual the electronic component 10 and other electronic components.

Through the above steps, a number of the electronic component 10, which is shown in FIG. 1, can be manufactured together with the other electronic components.

A resonator with a resonant frequency of 2 GHz can be manufactured by, for example, the following procedure: a single-crystalline piezoelectric substrate made of 90°-rotated Y-cut Z-propagation LiTaO$_3$ is used as the piezoelectric body 20, the electrode structure 16 including the IDT electrode and the reflectors as a plate wave resonant electrode in such a manner that a Ti layer with a thickness of about 10 nm, for example, is formed on a piezoelectric film prepared from the substrate, an Al layer with a thickness of about 250 nm, for example, is formed on the Ti layer, and the Al and Ti layers are patterned by photolithography, the IDT electrode includes electrode fingers and the wavelength λ of a plate wave depending on the pitch of the electrode fingers preferably is about 7 μm, for example, each reflector includes electrode fingers and the wavelength λ of the plate wave depending on the pitch of these electrode fingers preferably is about 7 μm, for example.

Since the single-crystalline piezoelectric substrate is used as the piezoelectric body 20 and sacrificial layers are formed on a flat surface of the single-crystalline piezoelectric substrate, ordinary front-end steps can be used.

The piezoelectric film 24 is not formed in such a manner that a material for forming the piezoelectric film 24 is deposited on a support member by sputtering or CVD but is formed in such a manner that the piezoelectric body 20, which is single-crystalline, is divided. Therefore, the electronic component 10 can be manufactured so as to have better device properties as compared to the case of using such a deposition process to form the piezoelectric film 24.

In the case where sacrificial layers are formed in recessed portions disposed in a support member and a piezoelectric body is bonded to this support member, a step of planarizing these sacrificial layers and a peripheral portion of this support member is necessary. However, the above method requires no planarization step because the sacrificial layers 30 are formed on the piezoelectric body 20 and the support member 34 is then formed.

Since the support member 34 is formed on the adhesive layer 32, which lies on the piezoelectric body 20, and the piezoelectric film 24 is then separated from the piezoelectric body 20, the time that forces act on the interface between the piezoelectric body 20 (or the piezoelectric film 24) and the support member 34 is shorter as compared to the case of polishing a piezoelectric body bonded to a support member. This secures the adhesion between the piezoelectric film 24 and the support member 34 and the reliability thereof.

The method does not require a bonding machine which is necessary to bond a piezoelectric body to a support member. The bonding machine is usually expensive and has low throughput.

The present invention is not limited to the above preferred embodiments. Various modifications may be made within the scope of the present invention.

For example, perforations may be formed in the support member 34 such that the sacrificial layers 30 are removed through the perforations. Element patterns such as IDT electrodes and/or a portion of a wiring pattern may be formed on a principal surface of the piezoelectric film 24 that faces the support member 34.

The present invention is applicable not only to plate wave devices using plate waves such as Lamb waves or plate waves but also to electronic components including support members and vibrating or movable portions such as gyros or RF switches, the vibrating or movable portions being levitationally supported with the support members.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a support member;
    a piezoelectric film having a pair of principal surfaces substantially parallel to each other and including a first portion that is not supported by the support member and a second portion supported by the support member;
    an adhesive layer which is disposed between the support member and the second portion of the piezoelectric film and which is in contact with the support member and the second portion of the piezoelectric film; and
    electrodes arranged on at least one of the principal surfaces of the first portion of the piezoelectric film; wherein
    the adhesive layer has a first surface in contact with the support member and a second surface in contact with the second portion of the piezoelectric film and the first surface of the adhesive layer has a roughness greater than that of the second surface thereof.

2. The electronic component according to claim 1, wherein the principal surfaces of the piezoelectric film are mirror surfaces.

3. The electronic component according to claim 1, wherein the electrodes are arranged to excite a plate wave propagating through the piezoelectric film.

* * * * *